(12) United States Patent
Akatsu et al.

(10) Patent No.: US 7,190,046 B2
(45) Date of Patent: Mar. 13, 2007

(54) BIPOLAR TRANSISTOR HAVING REDUCED COLLECTOR-BASE CAPACITANCE

(75) Inventors: Hiroyuki Akatsu, Yorktown Heights, NY (US); Rama Divakaruni, Ossining, NY (US); Marwan Khater, Poughkeepsie, NY (US); Christopher M. Schnabel, Poughkeepsie, NY (US); William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 10/708,860

(22) Filed: Mar. 29, 2004

(65) Prior Publication Data

US 2005/0212087 A1 Sep. 29, 2005

(51) Int. Cl.
*H01L 27/082* (2006.01)
*H01L 21/331* (2006.01)

(52) U.S. Cl. ............... 257/565; 257/522; 257/E21.573; 257/E21.581; 438/318; 438/322

(58) Field of Classification Search ............... 257/522, 257/565
See application file for complete search history.

(56) References Cited

U.S. PATENT DOCUMENTS 5,128,271 A    7/1992   Bronner et al.
5,494,836 A    2/1996   Imai
5,506,427 A    4/1996   Imai
5,798,561 A *  8/1998   Sato ............................. 257/588
5,930,635 A *  7/1999   Bashir et al. ............... 438/313
5,962,880 A * 10/1999   Oda et al. .................... 257/198
6,346,453 B1   2/2002   Kovacic et al.
6,492,238 B1* 12/2002   Ahlgren et al. ............. 438/322
6,777,302 B1*  8/2004   Chen et al. .................. 438/335
6,940,149 B1*  9/2005   Divakaruni et al. ........ 257/565
6,964,907 B1* 11/2005   Hopper et al. .............. 438/318
7,022,578 B2*  4/2006   Verma et al. ............... 438/312
2003/0057458 A1  3/2003  Freeman et al.
2003/0109109 A1  6/2003  Freeman et al.

\* cited by examiner

*Primary Examiner*—Andy Huynh
*Assistant Examiner*—Dao H. Nguyen
(74) *Attorney, Agent, or Firm*—Daryl K. Neff; H. Daniel Schnurmann

(57) ABSTRACT

Structure and method are provided for forming a bipolar transistor. As disclosed, an intrinsic base layer is provided overlying a collector layer. A low-capacitance region is disposed laterally adjacent the collector layer. The low-capacitance region includes at least one of a dielectric region and a void disposed in an undercut underlying the intrinsic base layer. An emitter layer overlies the intrinsic base layer, and a raised extrinsic base layer overlies the intrinsic base layer.

18 Claims, 8 Drawing Sheets

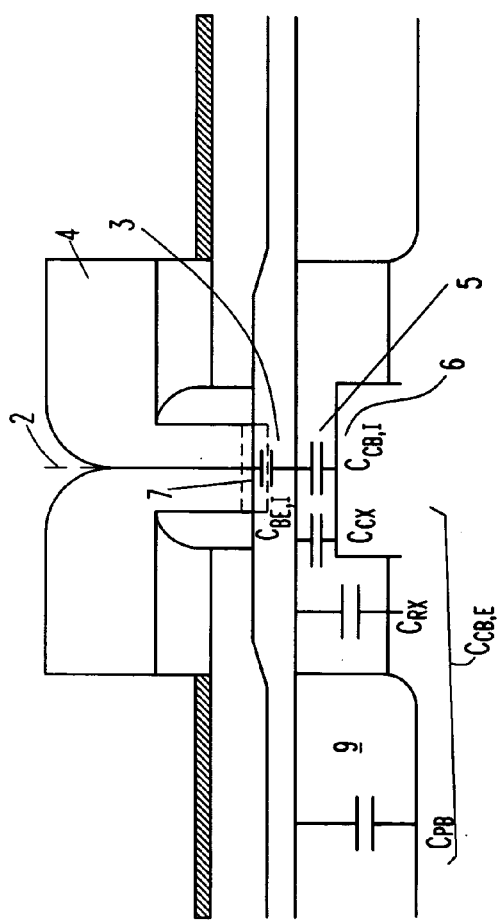
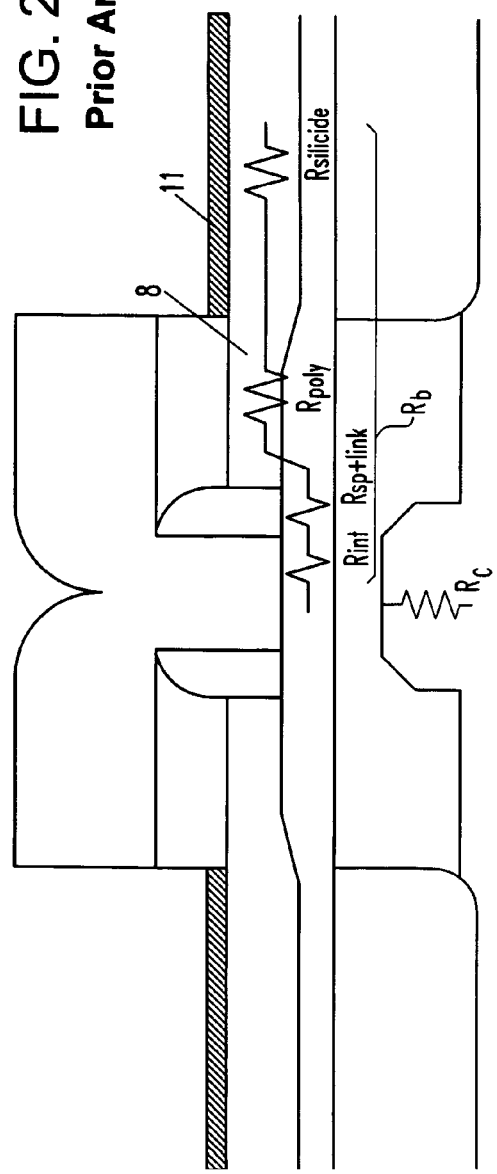

BIPOLAR TRANSISTOR HAVING REDUCED COLLECTOR-BASE CAPACITANCE

BACKGROUND OF INVENTION

The present invention relates to integrated circuit devices and their fabrication.

High performance circuits, especially those used for radio frequency chips, favor the use of heterojunction bipolar transistors (HBTs) to provide high maximum oscillation frequency $f_{MAX}$ and high transit frequency $f_T$, also referred to as "cutoff frequency". HBTs have a structure that includes a junction formed by juxtaposing two dissimilar semiconductors. For example, an HBT may have a base layer including a semiconductor alloy material such as silicon germanium (SiGe), having substantial germanium content and profile, juxtaposed to a collector region of silicon or an emitter layer of polysilicon.

An advantage of an HBT is that a heterojunction can be designed to have a large current gain. Increased current gain permits the resistance of the base to be decreased by allowing a higher dopant concentration to be provided in the base of the transistor. To increase the performance of an HBT, it is desirable to increase both the transit frequency $f_T$ and the maximum oscillation frequency $f_{MAX}$. $f_{MAX}$ is a function of $f_T$, parasitic resistances and parasitic capacitances (both collectively referred to herein as "parasitics") between elements of the transistor according to the formula $$f_{MAX} = (f_T / 8\pi * C_{cb} * R_b)^{1/2}.$$

The parasitics of the HBT include the following parasitic capacitances and resistances, as listed in Table 1:

TABLE 1

$C_{cb}$ collector-base capacitance
$C_{eb}$ emitter-base capacitance
$R_c$ collector resistance
$R_e$ emitter resistance
$R_b$ base resistance The most significant parasitics are the collector-base capacitance $C_{cb}$ and the base resistance $R_b$, because they provide an electrical feedback path between the output and input of the transistor, reducing power gain and thus reducing gain-dependent figures of merit including $f_{MAX}$. Their values are typically larger than the other parasitics, making their effects on $f_T$ and $f_{MAX}$ more pronounced. Thus, it is desirable to provide an HBT structure and method by which $C_{cb}$ and $R_b$ are significantly reduced.

An example of a state of the art heterojunction bipolar transistor (HBT) structure containing parasitics is illustrated in FIG. 1. As depicted in the cross-sectional view therein, an ideal or "intrinsic" device consists of a one-dimensional slice downward through the centerline 2 of the HBT, through emitter 4, intrinsic base layer 3, and collector 6. The emitter 4 is generally heavily doped with a particular dopant type, (e.g. n-type), and generally consists essentially of polycrystalline silicon (hereinafter, "polysilicon"). The intrinsic base 3 is predominantly doped with the opposite type dopant (e.g. p-type), and less heavily than the emitter 4. The collector 6 is doped predominantly with the same dopant (e.g. n-type) as the emitter 4, but even less heavily than the intrinsic base 3. Region 5 represents the depletion region disposed between the intrinsic base 3 and the collector 6, due to the p-n junction between the base and collector, which have different predominant dopant types. Region 7 represents the depletion region disposed between the intrinsic base 3 and the emitter 4, due to the p-n junction between the base and emitter, which have different predominant dopant types. Often, the intrinsic base 3 is formed of silicon germanium (SiGe), which is epitaxially grown on the surface of the underlying collector 6.

The ideal structure itself contains two capacitances that impact performance. Intrinsic emitter-base capacitance $C_{BE,I}$ arises at the junction 7 between the emitter 4 and the base 3. In addition, there is an intrinsic collector base capacitance $C_{CB,I}$ at the junction 5 between the collector region and the base. The values of these capacitances are related to the areas of the respective junctions, as well as to the quantities of dopant on either side of the respective junctions. Although these capacitances impact the power gain of the transistor, they are an inextricable part of the ideal transistor structure and thus cannot be fully eliminated.

Unfortunately, a one-dimensional transistor, which is free of all material beyond the intrinsic device, cannot be realized in a practical process. A typical transistor contains additional parasitics stemming from interaction between the intrinsic device and other material structures in which the intrinsic device is embedded. Such material structures help provide electrical access to and heat transfer away from the intrinsic device. One such parasitic having a key impact upon power gain is the extrinsic collector base capacitance $C_{CB,E}$. As shown in FIG. 1, $C_{CX}$ and $C_{RX}$ are components of the extrinsic collector base capacitance $C_{CB,E}$. The first component capacitance $C_{CX}$ results from interaction between the extrinsic base of the device and the collector pedestal. The second component capacitance $C_{RX}$ results from interaction between the extrinsic base of the device and the bulk substrate portion of the collector, between the edge of a shallow trench isolation (STI) 9 and the collector pedestal 6. An additional component capacitance $C_{PB}$ is the capacitance of the extrinsic base and substrate where separated by the STI. Ideally, the fabrication process of an HBT results in an STI having a thickness which is sufficient to avoid substantial $C_{PB}$. In such case, the parasitic capacitances $C_{CB,I}$, $C_{CX}$ and $C_{RX}$ contribute more significantly to the overall collector base capacitance $C_{cb}$ than $C_{PB}$.

As illustrated in FIG. 2, the extrinsic base resistance $R_b$ is a second important parasitic. $R_b$ represents the series resistance between the external base contact and the intrinsic base film. The components of the base resistance $R_b$ include: $R_{int}$, which is a function of the size of the emitter and the intrinsic base profile. Another component, $R_{sp+link}$, is a function of the width of the spacer separating the raised extrinsic base layer from the emitter, and is also a function of the interface quality of the link between the intrinsic base and the raised extrinsic base. Another component is $R_{poly}$, which is function of the thickness, doping and alignment of the edge of the silicide 11 (when present) to the polysilicon layer 8 of the raised extrinsic base. $R_{silicide}$, is a component which is a function of the dimension of the polysilicon over which the silicide 11 is disposed. The parasitic resistances $R_{poly}$ and $R_{silicide}$ contribute significantly to overall base resistance $R_b$.

Typically, moving the extrinsic base elements closer to the intrinsic device reduces $R_b$. However, such an approach tends to increase the extrinsic collector base capacitance $C_{CB,E}$, creating a fundamental tradeoff between the two parasitics and making it hard to improve overall power gain. Narrowing the collector pedestal itself can also reduce $C_{CB,E}$. Such a reduction is difficult to achieve, however, since the pedestal is typically formed by implantation of dopants, which tend to scatter laterally during implantation and to diffuse laterally during the typical heating that a transistor experiences during fabrication. Narrowing the collector pedestal also increases the collector resistance ($R_C$) of the collector pedestal, impacting high frequency performance. Thus, it is desirable to avoid narrowing the collector pedestal.

A structure and method of confining the lateral dimension of the collector pedestal near the point of interaction with the extrinsic base, while maintaining low $R_C$ and preserving tolerance against process thermal cycle would be of major advantage in improving the high-frequency gain of a bipolar transistor.

Therefore, it would be desirable to provide a structure and method of fabricating a bipolar transistor having reduced extrinsic collector base capacitance $C_{CB,E}$ without significantly impacting the extrinsic emitter base resistance $R_b$ or the collector resistance $R_C$, so as to achieve superior high-frequency power gain.

Commonly assigned, co-pending U.S. patent application Ser. No. 10/249,299 describes an HBT having reduced collector-base capacitance and resistance, by vertically interposing first and second shallow trench isolation (STI) structures between the collector, which underlies the STI, and the raised extrinsic base which overlies the STI.

It would further be desirable to increase the transit frequency $f_T$ and maximum oscillation frequency $f_{MAX}$ through change in one or more of the vertical profiles of the collector, base, emitter and/or the junctions between them.

SUMMARY OF INVENTION

Structure and method are provided for forming a bipolar transistor. As disclosed, an intrinsic base layer is provided overlying a collector layer. A low-capacitance region is disposed laterally adjacent the collector layer. The low-capacitance region includes at least one of a dielectric region and a void disposed in an undercut underlying the intrinsic base layer. An emitter layer overlies the intrinsic base layer, and a raised extrinsic base layer overlies the intrinsic base layer.

BRIEF DESCRIPTION OF DRAWINGS

FIG. 1 illustrates components of collector base capacitance in relation to the structure of an HBT.

FIG. 2 illustrates components of base resistance and collector resistance in relation to the structure of an HBT.

DETAILED DESCRIPTION

The embodiments of the invention described herein provide a structure and method for forming a bipolar transistor having reduced collector-base capacitance ($C_{cb}$). Reducing the collector-base capacitance affects the power gain of the transistor, helping to increase $f_T$ and $f_{MAX}$. According to the embodiments of the invention, these goals are furthered without significantly increasing series resistance ($R_c$) or base resistance ($R_b$), thus enabling improvements to be achieved in the gain and frequency range of a bipolar transistor.

The bipolar transistor according to an embodiment described herein includes an evacuated or gas-filled void occupying at least part of the space between the base and the collector. The presence of a void, in place of a solid dielectric such as silicon dioxide or silicon nitride, reduces the dielectric constant, typically by a ratio of three to one or greater. Capacitance C is directly related to the dielectric constant k according to the relation C=kA/d. Thus, the presence of the void decreases the collector-base capacitance when the area A of the base fronting the collector and the distance d between them remain the same.

Figure 3:
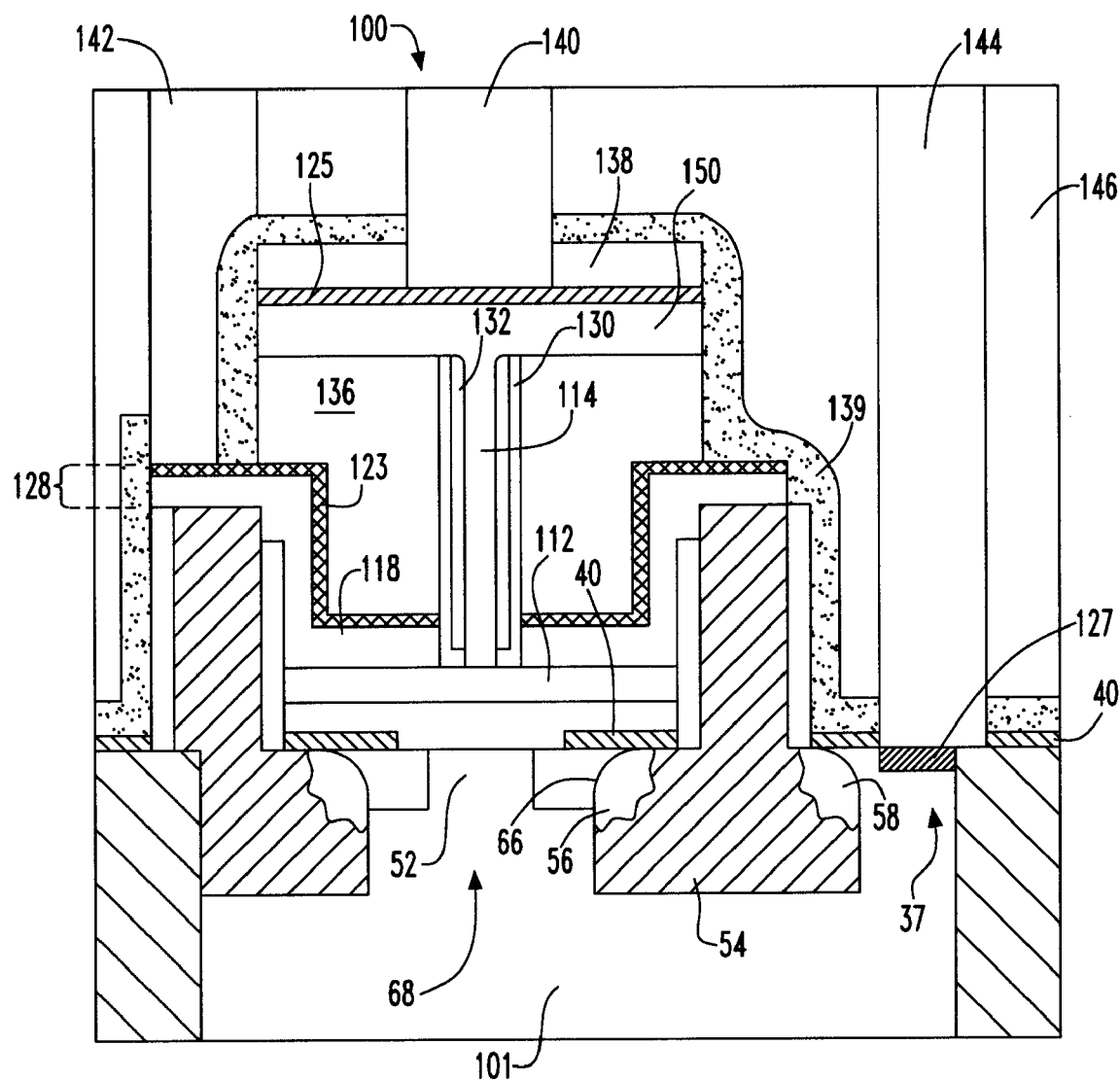
FIG. 3 illustrates a heterojunction bipolar transistor according to an embodiment of the invention.

FIG. 3 is a cross-sectional view illustrating a bipolar transistor 100 according to an embodiment of the invention. As shown therein, transistor 100 includes a collector layer 52 disposed within a collector pedestal 68 formed in substrate layer 101 of single-crystal semiconductor material. The single-crystal semiconductor material is preferably silicon. An annular low-capacitance region 54 including a solid dielectric material is disposed laterally adjacent to the collector layer 52. The solid dielectric material is preferably a deposited oxide, as described more fully below. In the preferred embodiment shown in FIG. 3, a void 56 is disposed immediately adjacent a sidewall 66 of the silicon material in which the collector pedestal 68 is disposed. The void 56 may be evacuated. Alternatively, the void may be filled with a gas which is inert or otherwise essentially nonreactive with materials with which it contacts, i.e., the semiconductor material of the substrate layer 101, the solid dielectric material of region 54, and an oxide layer 40 disposed above the void 56. Another void 58 is preferably disposed in an undercut region adjacent a collector reach-through region 37.

An intrinsic base layer 112 is disposed over the collector layer 52, the low-capacitance region 54 and void 56. The emitter 114 is disposed over a central portion of the intrinsic base layer 112. A raised extrinsic base 128 is disposed over a portion of the intrinsic base layer 112, having an annular shape, surrounding the emitter 114. The intrinsic base layer 112 preferably includes a region of single-crystal silicon germanium (SiGe) overlying the collector layer 52 and disposed below the emitter 114, such that heterojunctions result between the SiGe region and the silicon regions lying above and below the SiGe region. For example, a heterojunction results between the SiGe region and the silicon of the collector layer 52 and/or the emitter 114. The raised extrinsic base 128 preferably includes a layer of polysilicon 118 overlying the intrinsic base layer 112, over which a low-resistance layer 123 is disposed. The low-resistance layer preferably consists essentially of one or more metals and/or metal silicides.

The emitter 114 provides a conductive path to the intrinsic base layer 112 through an opening in the raised extrinsic base 128. The emitter is insulated from the raised extrinsic base 128 by a pair of dielectric spacers 130 and 132. Spacer 130 is preferably formed of an oxide, e.g. silicon dioxide, while spacer 132 is preferably formed of a nitride, e.g. silicon nitride. The emitter 114 has an upper portion 150 including a layer of heavily doped polysilicon and a low-resistance layer 125 including a metal and/or a metal silicide overlying the polysilicon layer. A layer of oxide 136 separates the upper portion 150 of emitter 114 from the raised extrinsic base 128. In a preferred embodiment, a layer of oxide 138 is also disposed over the low-resistance layer 125 of the upper portion of the emitter 114. A low-resistance layer 127 such as a metal silicide layer is disposed at a surface of the collector reach-through region 37. An additional dielectric layer 139 is provided as a conformal coating on or overlying the oxide layer 138, the portion of the raised extrinsic base 128 that is not covered by oxide layer 136, and other areas of the structure, such as partially overlying the collector reach-through region 37. Dielectric layer 139 preferably consists essentially of silicon nitride.

Vertical contact from an overlying wiring level (not shown) is provided to each of the raised extrinsic base 128, emitter low-resistance layer 125 and the low-resistance layer 127 overlying the collector reach-through region 37 through metal- or metal silicide-filled vias 140, 142, and 144. The vias are etched into an overlying deposited interlevel dielectric layer (ILD) 146 and the conformal dielectric layer 139. Desirably, ILD 146 consists essentially of a deposited oxide, for example, silicon dioxide such as a TEOS oxide or borophosphosilicate glass (BPSG).

Figure 4:
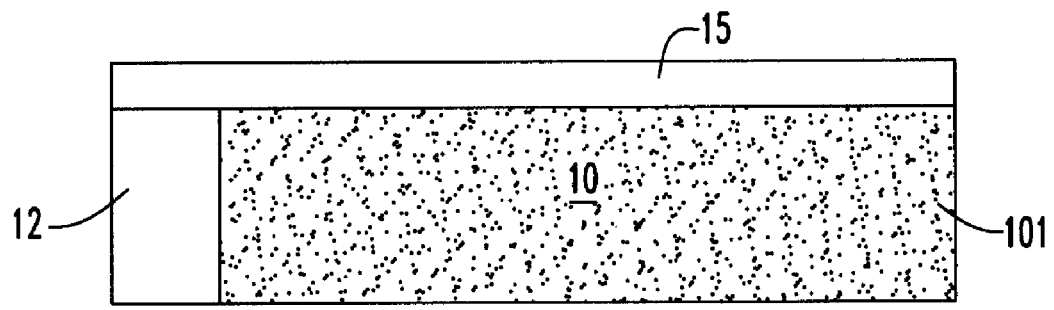
FIGS. 4 through 13 illustrate a method of fabricating the heterojunction bipolar transistor shown in FIG. 3 according to an embodiment of the invention.

A method of fabricating a bipolar transistor 100 as illustrated in FIG. 3 will now be described, with reference to FIGS. 3 through 13. As depicted in FIG. 4, a subcollector region 10 is implanted into substrate layer 101 consisting essentially of a single-crystal semiconductor material, for example, silicon. Region 12 represents a portion of substrate layer 101 which is not implanted as a result of this step. When the transistor to be made is an npn transistor, phosphorous ions are preferably implanted during this step to achieve a dopant concentration of about $10^{17}$ cm$^{-3}$ to $10^{18}$ cm$^{-3}$. When the transistor is to be a pnp transistor, boron ions are implanted. Hereinafter, reference will be made to the fabrication of an npn transistor, and the dopant types corresponding to the fabrication of an npn transistor will be described. After the implantation step, a layer 15 (hereinafter, "epitaxial layer") of intrinsic silicon or very lightly doped silicon (i.e. having a concentration of less than about $5\times10^{16}$ cm$^{-3}$) is epitaxially grown onto the surface of subcollector region 10.

Figure 5A:
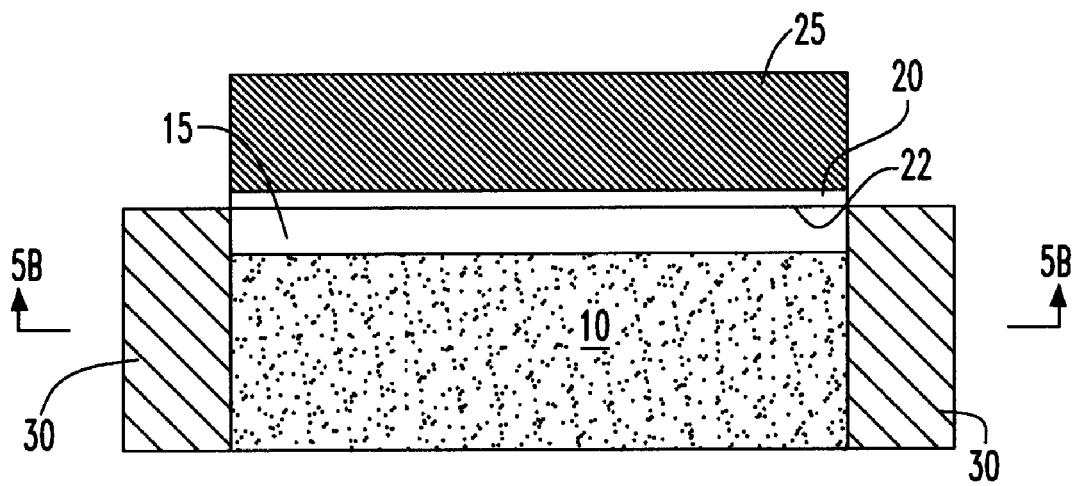
Figure 5B:
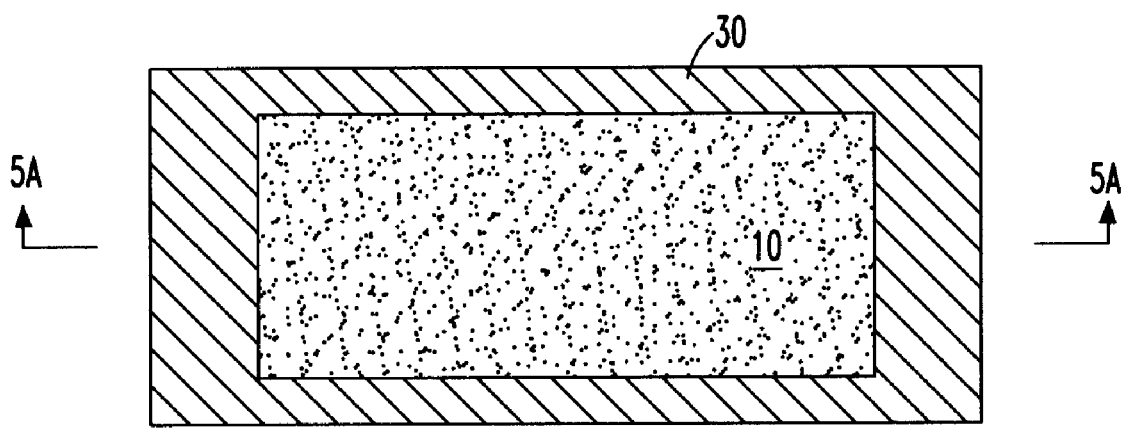

Next, as shown in the cross-sectional view of FIG. 5A and the top-down view of FIG. 5B, a pad oxide layer 20 and a pad nitride layer 25 are formed over the epitaxial layer 15 and patterned. Using the pad oxide and pad nitride layers as a mask, trenches are etched into epitaxial layer 15 and the substrate layer. Thereafter, the trenches are filled with an isolation material to form isolation trenches (ITs) 30. Preferably, the isolation material includes a dense silicon dioxide deposited by a high-density plasma deposition process. A liner material such as silicon nitride is preferably deposited in contact with the semiconductor material exposed along sidewalls of the trench, prior to depositing the oxide to fill the trenches. The filled ITs 30 are disposed laterally adjacent to the implanted subcollector region 10. As shown in the top-down view of FIG. 5B, an IT 30 surrounds the implanted subcollector region 10 on all sides. Referring again to FIG. 5A, IT 30 is desirably provided as a "deep trench isolation", typically extending to a depth of one micron or more from the top surface 22 of the epitaxial layer 15, and more desirably extending to a depth of two to three microns.

Figure 6:
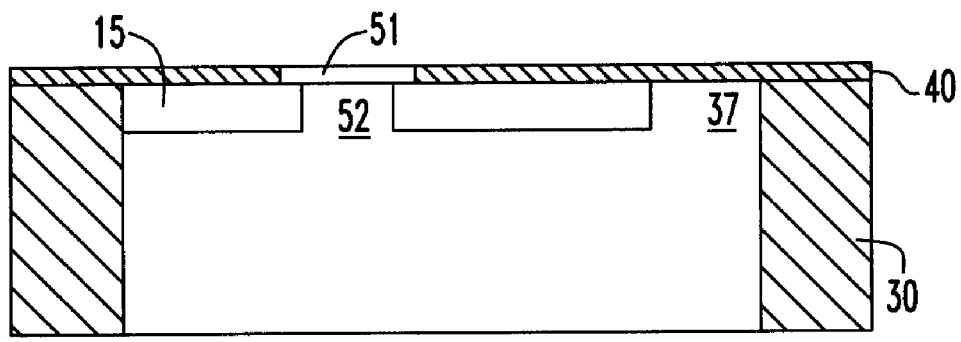
Figure 7A:
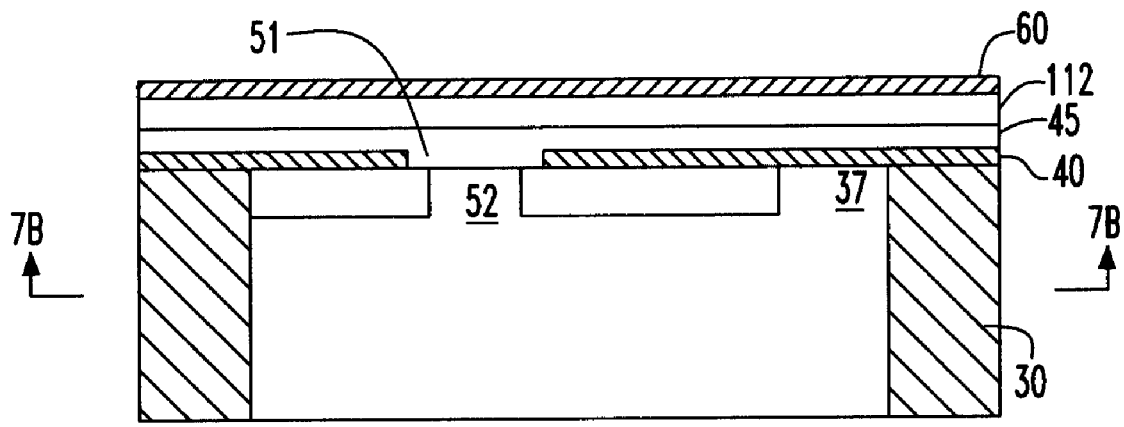
Figure 7B:
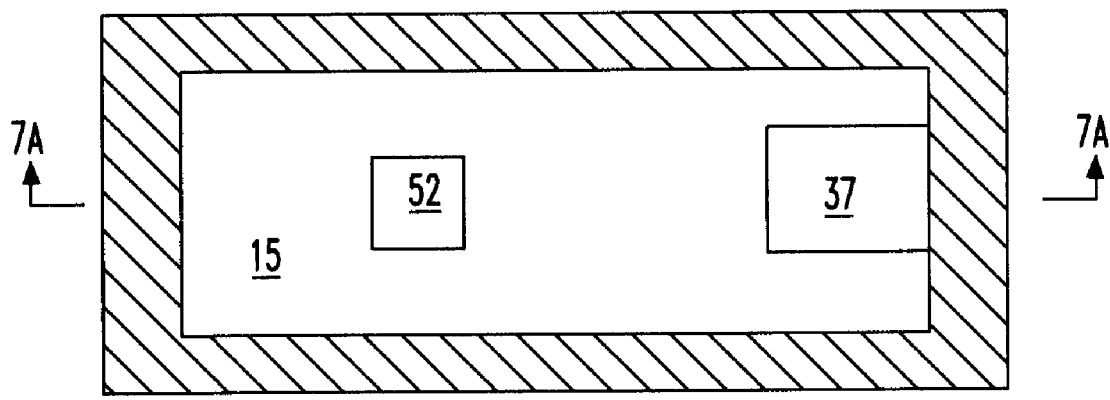

Following the filling of ITs 30 with isolation material, the structure is planarized to a level which exposes the top surface of the pad nitride 25. The pad nitride 25 is then removed, as by etching selective to the material of the pad oxide layer 20 which underlies the pad nitride. After removing the pad nitride, the pad oxide is preferably left in place as a sacrificial oxide, through which a collector region 52 and a collector reach-through region 37, shown in FIG. 6, are implanted with an n-type dopant by a masked selective implant process. Both regions 52 and 37 have portions disposed within epitaxial layer 15 requiring implantation due to the lightly doped or intrinsic nature of the epitaxial layer 15 prior to such implant. FIG. 7B is a top-down view illustrating the locations and general shape of the implanted regions 37 and 52 following such implant.

Processing to form a bipolar transistor such as an HBT is desirably integrated with the simultaneous processing of other devices, e.g. logic transistors formed in other areas of the same integrated circuit (IC or "chip"). Such other areas are generally referred to as "support areas" herein. To assist good process efficiency, the pad oxide 20 and pad nitride 25 (FIG. 5A) are the same as those used to pattern devices in the support areas. In an embodiment, the collector dopant implant to regions 37 and 52 is integrated with implants in the support areas, such as threshold adjustment implants to the channels of n-type field effect transistors (NFETs), and implants used to form n-wells of p-type field effect transistors (PFETs).

Referring to FIG. 6, after completing the dopant implants to regions 37 and 52, the pad oxide is removed and a second oxide layer 40 is formed on the surface of the epitaxial layer 15, in place of the pad oxide. The second oxide layer 40 is desirably utilized as a gate oxide by devices in the support areas. Preferably, a masking layer such as a photoresist and/or anti-reflective coating (ARC) layer (not shown) is deposited over the second oxide layer 40 where the bipolar transistor is being formed, at which time gate conductors and gate sidewall spacers are deposited and patterned in the support areas.

An opening 51 is then patterned in the oxide layer 40 above the implanted collector region 52. Referring to FIG. 7A, a layer 112 of semiconductor material having the opposite dopant type as the collector region 52 is then formed over the structure as an intrinsic base layer. This layer 112 is formed epitaxially as a single-crystal semiconductor film in the area immediately above the opening 51, while forming as a polycrystalline film elsewhere. Desirably, intrinsic base layer 112 consists essentially of a semiconductor alloy such as silicon germanium which is heavily doped to a concentration of between about $10^{18}$ cm$^{-3}$ to $10^{19}$ cm$^{-3}$ with a p-type dopant such as boron. A seed layer 45 may be deposited onto oxide layer 40 prior to forming the intrinsic base layer 112 to promote adhesion of the intrinsic base layer 112 to the oxide layer 40 and/or assist in promoting other desired features of the structure. Thereafter, a layer of oxide 60 is formed over the intrinsic base layer 112.

Figure 8A:
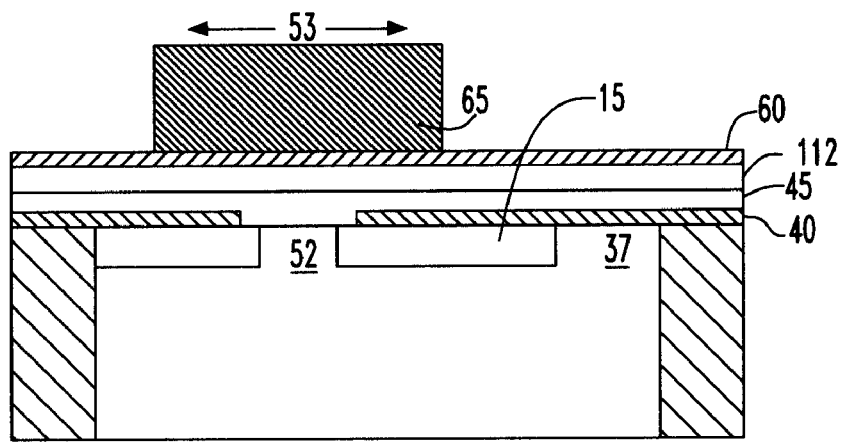

Referring to FIG. 8A, a layer of silicon nitride is deposited and photolithographically patterned to form a hardmask feature 65. As best shown in FIG. 8D, the patterned hardmask feature 65 has a dimension 53 in a first horizontal direction and a dimension 50 in a second horizontal direction transverse to the first horizontal direction. Preferably, the dimensions 50 and 53 are the same or essentially the same, such that the hardmask feature 65 is essentially square.

Figure 8B:
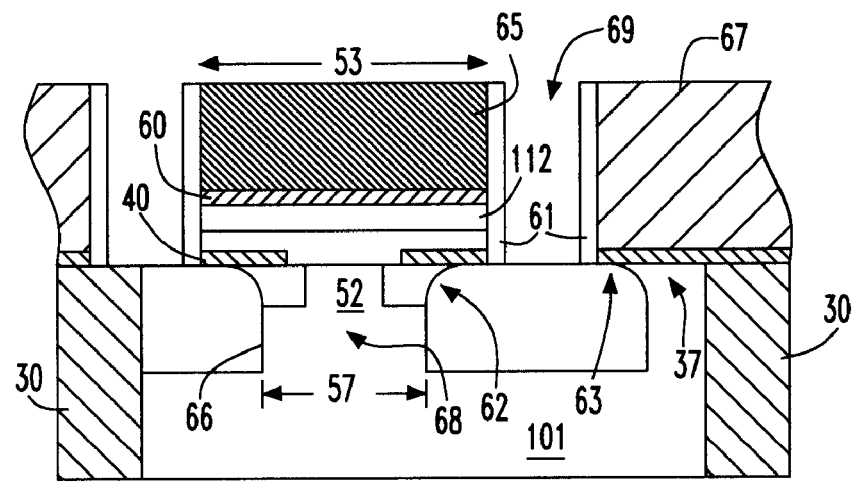
Figure 8C:
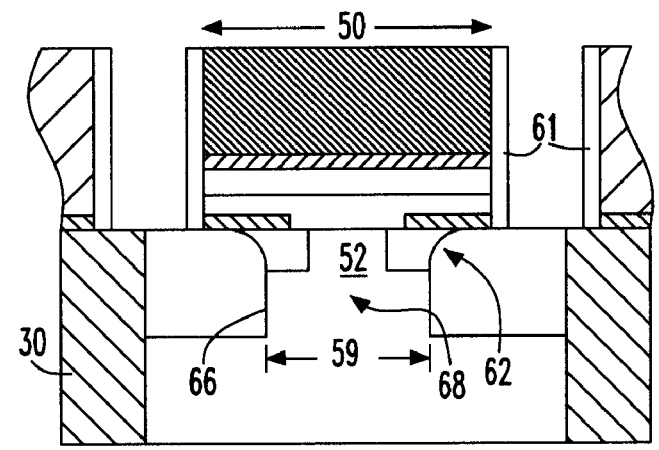
Figure 8D:
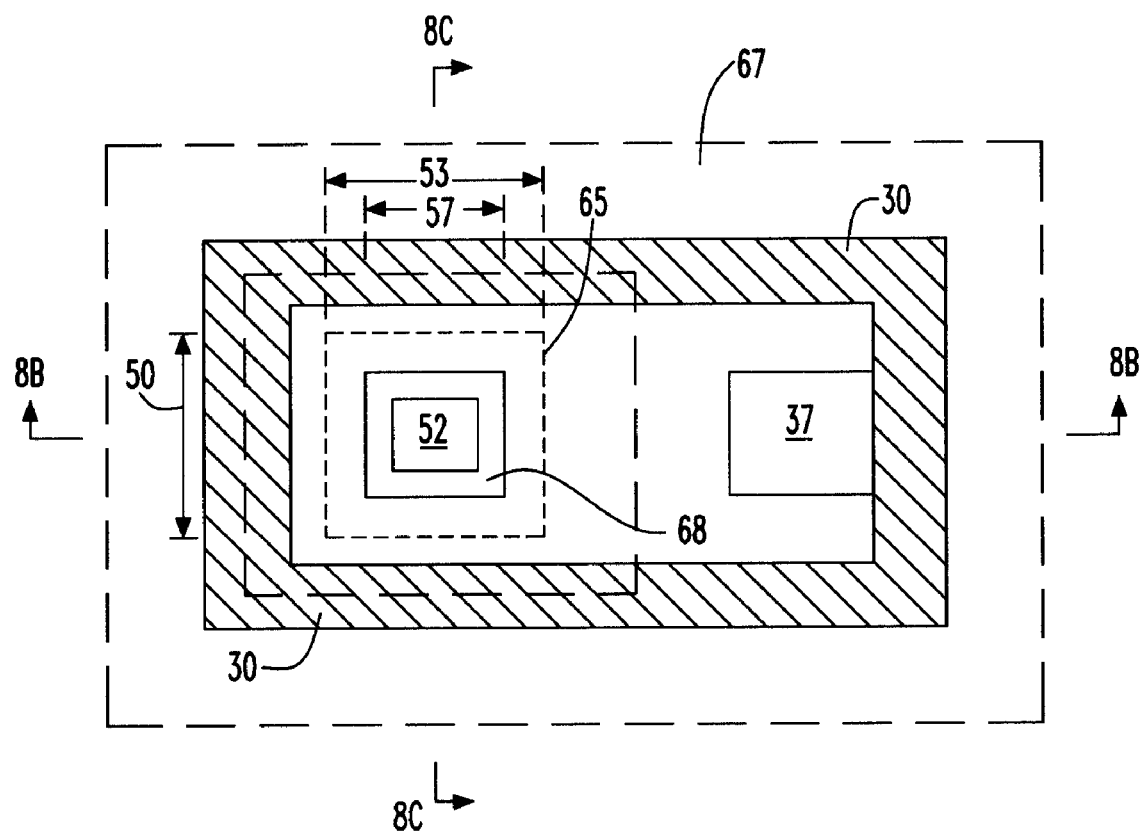

Referring to FIG. 8B, a series of steps are performed, resulting in the silicon material of the substrate being removed from an undercut region 62 disposed under the intrinsic base layer 112. A reactive ion etch is performed to pattern the stack of oxide layer 60, intrinsic base layer 112 and the seed layer 45 (when present), using the previously formed hardmask feature 65. Thereafter, an additional hardmask layer, preferably of silicon nitride, is deposited and patterned to form hardmask feature 67. As a result of patterning to form hardmask feature 67, an opening 69 results between the hardmask features 65 and 67. FIG. 8C provides a cross-sectional view of this stage of fabrication which is transverse to the view shown in FIG. 8B.

Thereafter, the oxide layer 40 is removed from the surface of the epitaxial layer from within the opening 69, as by wet etching. Sidewall spacers 61, preferably consisting of silicon dioxide, are then formed on sidewalls of the hard-mask features 65 and 67 and on exposed sidewalls of the oxide layer 40, seed layer 45 (when present), intrinsic base layer 112 and oxide layer 60. Alternatively, in one embodiment, prior to removal of the oxide layer 40, a conformal layer of oxide is deposited on sidewalls of the hardmask features 65, 67 and exposed sidewalls of seed layer 45 (when present), intrinsic base layer 112, and oxide layer 60. In such embodiment, the conformal oxide layer is etched selective to nitride by a reactive ion etch to form sidewall spacers on sidewalls of the hardmask features 65, 67 and seed layer 45 (when present), intrinsic base layer 112 and oxide layer 60, while simultaneously removing the oxide layer 40 from the surface of the epitaxial layer.

With the intrinsic base layer 112 thus protected by oxide layer 40 and oxide sidewall spacer 61, the silicon material of the epitaxial layer 15 (FIG. 8A) and substrate layer 101 that were previously covered by the oxide layer 40 are now etched from below the opening 69 defined by spacers 61. Preferably, this step is performed by a wet etch using ammonium hydroxide (NH$_4$OH) or a chemical downstream etch (CDE) to create the structure shown. This etch step also removes silicon material from an undercut region 62 below the intrinsic base layer 112. As a result, a collector pedestal 68 is formed having a lateral dimension 57 that is less than the lateral dimension 53 of the intrinsic base layer. This etch step also results in silicon material being removed from an undercut region 63 adjacent to the collector reach-through region 37.

At this time, gas phase doping is preferably performed to increase the concentration of dopant material in the collector pedestal 68, which may include increasing the dopant concentration in the implanted collector region 52. Such doping is performed to provide a nominal dopant concentration in the collector pedestal 68 of $10^{20}$ cm$^{-3}$. For making an npn type transistor, the dopant source gas preferably includes arsenic, but phosphorous and/or a combination of arsenic and phosphorous can also be used.

Figure 9:
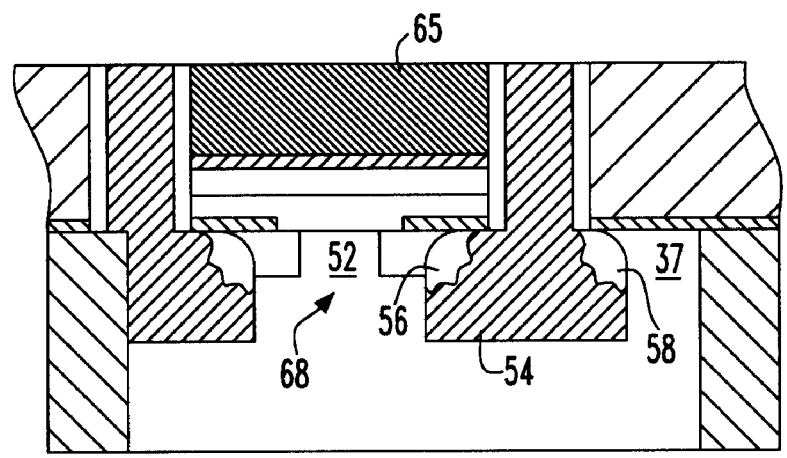

Thereafter, as shown in FIG. 9, a dielectric material is deposited to form a dielectric region 54 within the opening etched in the substrate. The dielectric material is then planarized to the top of the nitride hardmask feature 65, as by chemical mechanical polishing (CMP) to form the structure shown. The dielectric material preferably consists essentially of an oxide material and is preferably deposited by a low temperature process such as a subatmospheric chemical vapor deposition (SACVD) or deposition of borophosphosilicate glass (BPSG). The oxide material desirably has less than optimum gapfill characteristics such that a void 56 results within the undercut region adjacent the collector pedestal 68 including collector region 52. Formation of a void 56 is preferred over merely filling the undercut region with a solid dielectric material because a void having a vacuum or gas (e.g. air) fill has a dielectric constant of one or nearly one. Another void 58 is preferably also disposed in an undercut region adjacent the collector reach-through region 37. A dielectric constant of one represents a 67% reduction compared to a traditional dielectric including silicon nitride and silicon dioxide which have dielectric constants of about three. The lowered dielectric constant due to the void in the undercut region results in reduced collector-base capacitance for the bipolar transistor 100 illustrated in FIG. 3.

Figure 10:
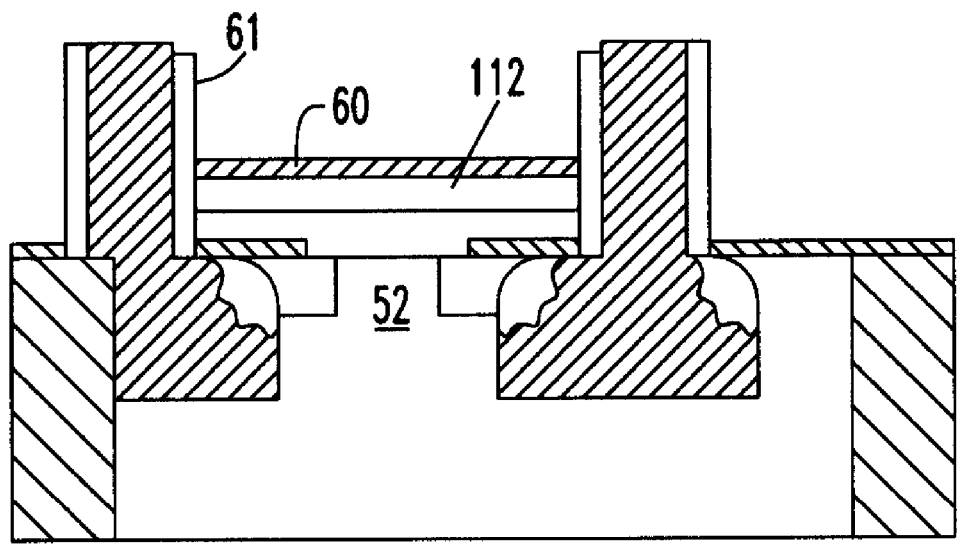

Thereafter, as shown in FIG. 10, the nitride hardmask features are removed, as by wet etching, selective to the oxide material of the oxide layer 60 and spacer 61. The oxide layer 60 is then removed, as by wet etching, selective to the material (SiGe) of the underlying intrinsic base layer 112.

Figure 11:
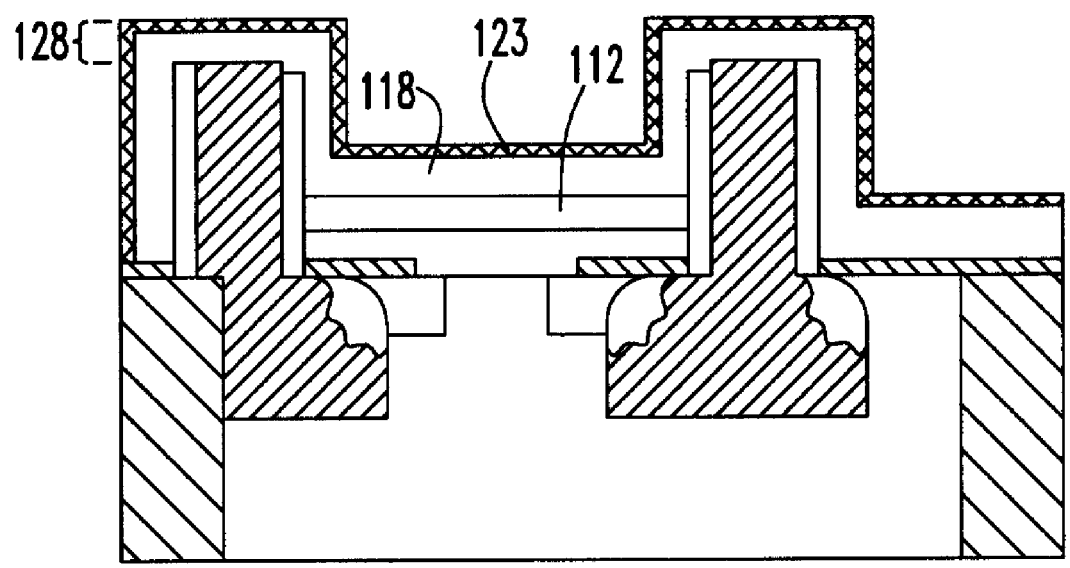

Next, as shown in FIG. 11, a layer of polysilicon 118 is deposited, followed by deposition of a metal, metal silicide or other formation of a silicide to form low-resistance layer 123, to provide a raised extrinsic base 128 over the intrinsic base layer 112.

Figure 12:
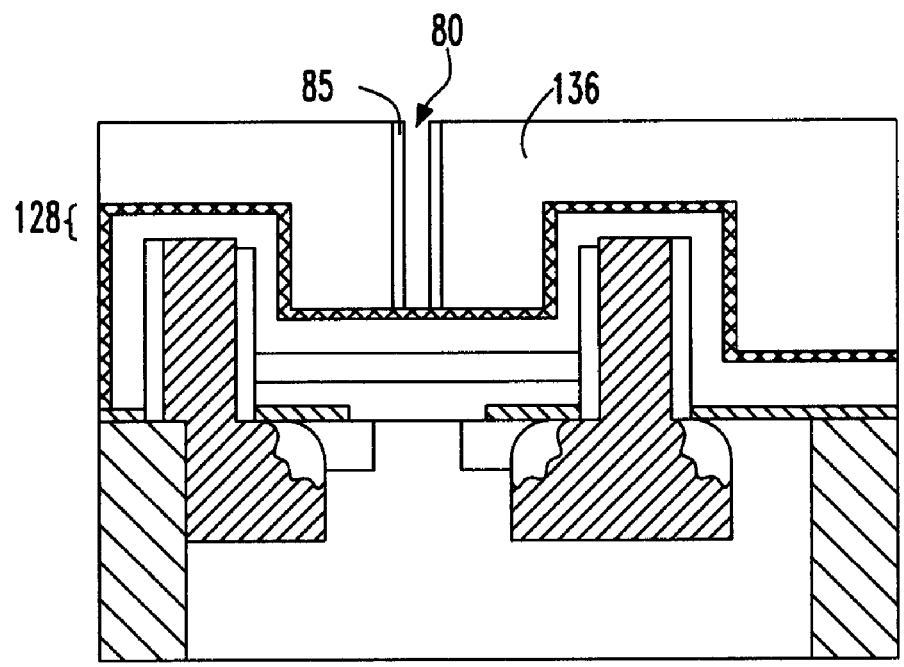

Thereafter, with reference to FIGS. 12, 13 and 3 again, steps are performed to complete the structure of the transistor. As shown in FIG. 12, a layer consisting essentially of an oxide 136 is deposited and patterned to form an opening 80 above the raised extrinsic base 128. A sacrificial spacer 85 of silicon nitride is optionally formed on the sidewall of the opening 80, for the purpose of dimensional control, for example.

Figure 13:
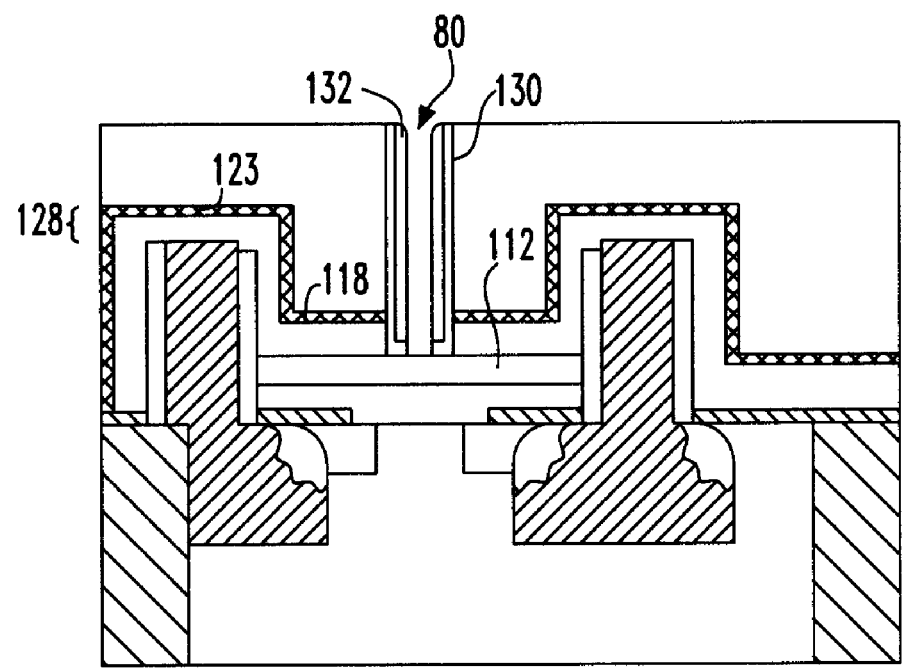

Thereafter, as shown in FIG. 13, an opening is etched in the low-resistance layer 123 and polysilicon layer 118 of the raised extrinsic base 128, as by wet etching. Selective etching can be used to form the opening, since the silicide 123 is etch distinguishable from the polysilicon layer 118, and the polysilicon layer 118 is etch distinguishable from the intrinsic base layer 112, particularly when the intrinsic base layer consists essentially of silicon germanium having a substantial germanium content.

In a particular embodiment, the polysilicon layer 118 is provided as a relatively thick layer. In such case, a wet etch of the polysilicon layer 118 selective to SiGe might not be sufficiently selective to avoid damaging the SiGe intrinsic base layer 112, particularly after "overetching", as is commonly practiced to compensate for variations in the thickness of a layer at different locations of a wafer. In such case, better selectivity can be obtained by replacing the polysilicon layer 118 with a relatively thick layer of polycrystalline SiGe disposed over a relatively thin layer of polysilicon, as described in commonly assigned, co-pending U.S. patent application Ser. No. 10/707,712 filed Jan. 6, 2004 such application being hereby incorporated herein by reference. Even greater etch selectivity is obtained when the SiGe layer is heavily doped with boron. In such case, a reactive ion etch can be performed to etch the upper SiGe layer, selective to the relatively thin polysilicon layer below. Afterwards, the relatively thin polysilicon layer is wet etched, selective to the underlying SiGe intrinsic base layer.

Thereafter, the sacrificial spacer 85 (FIG. 12) is removed, followed by the formation of the oxide spacer 130 and nitride spacer 132 in the opening 80. These spacers are formed by depositing an oxide layer and then depositing a nitride layer over the oxide layer. Thereafter, the nitride layer is etched by a reactive ion etch, selective to oxide. The underlying oxide layer is then etched from within the opening 80 to clear the surface of the intrinsic base layer 112, such as by wet etching.

Finally, referring again to FIG. 3, a T-shaped emitter 114 is formed having an upper portion 150 disposed above a lower portion. The upper portion is broader than the lower portion which contacts the intrinsic base layer 112, the broad upper portion serving as a conductive land onto which contact is made to the emitter through a conductive via 140. The emitter 114 is formed by the following steps. A layer of heavily doped n-type polysilicon is deposited to fill the opening between spacers 132 and to overlie oxide layer 136. Thereafter, a low-resistance layer 125 is formed in electrical contact with the upper portion 150 of the emitter, as by deposition of a metal and/or a metal silicide or formation of a self-aligned silicide by well-known technique. An oxide layer 138 is then deposited to cover the low-resistance layer 125.

Thereafter, the stack of layers including oxide layer 138, low-resistance layer 125, polysilicon layer 150, and oxide layer 136 are patterned by etching, such as by RIE, stopping on the low-resistance layer 123. Thereafter, the low-resistance layer 123 and polysilicon layer 118 are also patterned to final dimensions, stopping on the oxide layer 40. Thereafter, a conformal dielectric layer of material such as silicon nitride 139 is formed over the structure to cover previously exposed sidewalls of the raised extrinsic base 128, emitter upper portion 150, low-resistance layer 125 and the oxide layers 136 and 138.

A thick interlevel dielectric layer (ILD) 146 is then deposited over the structure. The interlevel dielectric 146 desirably consists essentially of a highly flowable deposited oxide, for example, silicon dioxide such as deposited from a TEOS precursor or borophosphosilicate glass (BPSG). Vertical contact vias 140, 142, and 144 are then etched in the ILD 146. The conformal nitride layer 139 functions as an etch stop during such etch, which is performed selective to nitride. Thereafter, openings are etched in the nitride layer 139. An optional low-resistance layer 127 such as a metal silicide can then be formed on a surface of the collector reach-through region 37. The vias are thereafter filled with a metal or metal-silicide to complete the bipolar transistor structure 100 illustrated in FIG. 3.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A bipolar transistor, comprising:
   a collector layer including an active portion having a relatively high dopant concentration and a second portion having a low dopant concentration of less than about $5 \times 10^{16}$ cm$^{-3}$;
   an epitaxial intrinsic base layer overlying said collector layer in conductive communication with said active portion of said collector layer;
   a low-capacitance region laterally adjacent to said second portion of said collector layer including a dielectric region disposed in an undercut directly underlying said intrinsic base layer;
   an emitter layer overlying said intrinsic base layer; and
   a raised extrinsic base layer overlying said intrinsic base layer.

2. A bipolar transistor as claimed in claim 1, wherein said low-capacitance region includes at least one of a void and a solid dielectric region contacting second portion of said collector layer.

3. A bipolar transistor as claimed in claim 2, wherein said intrinsic base layer is surrounded by said dielectric region.

4. A bipolar transistor as claimed in claim 1, wherein said raised extrinsic base layer is self-aligned to said emitter layer.

5. A bipolar transistor as claimed in claim 4, wherein said raised extrinsic base layer is spaced from said emitter layer by a first spacer having a sidewall wholly in contact with said raised extrinsic base layer and a second spacer overlying said first spacer, said second spacer having a sidewall wholly in contact with said emitter layer.

6. A bipolar transistor as claimed in claim 1, wherein said active portion of said collector layer has a dopant concentration of about $10^{20}$ cm$^{-3}$.

7. A bipolar transistor as claimed in claim 1, further comprising a subcollector disposed below said collector layer, and a trench isolation region surrounding peripheral edges of said subcollector.

8. A bipolar transistor as claimed in claim 1, wherein said intrinsic base layer includes a layer of a single-crystal semiconductor material which forms a heterojunction with a material of at least one of said emitter layer and said collector layer.

9. A bipolar transistor as claimed in claim 1, wherein said single-crystal semiconductor material layer included in said intrinsic base layer includes silicon germanium.

10. A bipolar transistor, comprising:
    a collector layer including an active portion having a relatively high dopant concentration and a second portion having a low dopant concentration of less than about $5 \times 10^{16}$ cm$^{-3}$;
    an epitaxial intrinsic base layer overlying said collector layer;
    a low-capacitance region laterally adjacent to said collector layer including a void disposed in an undercut underlying said intrinsic base layer, said void being either evacuated or filled with a gas;
    an emitter layer overlying said intrinsic base layer; and
    a raised extrinsic base layer overlying said intrinsic base layer.

11. A bipolar transistor as claimed in claim 10, wherein said low-capacitance region further includes a solid dielectric region, wherein at least one of said void or said solid dielectric region contacts said second portion of said collector layer.

12. A bipolar transistor as claimed in claim 11, wherein said intrinsic base layer is laterally surrounded by said solid dielectric region.

13. A bipolar transistor as claimed in claim 10, wherein said raised extrinsic base layer is self-aligned to said emitter layer.

14. A bipolar transistor as claimed in claim 13, wherein said raised extrinsic base layer is spaced from said emitter layer by a first spacer having a sidewall wholly in contact with said raised extrinsic base layer and a second spacer overlying said first spacer, said second spacer having a sidewall wholly in contact with said emitter layer.

15. A bipolar transistor as claimed in claim 10, wherein said active portion of said collector layer has a dopant concentration of about $10^{20}$ cm$^{-3}$.

16. A bipolar transistor as claimed in claim 10, further comprising a subcollector disposed below said collector layer, and a trench isolation region surrounding peripheral edges of said subcollector.

17. A bipolar transistor as claimed in claim 10, wherein said intrinsic base layer includes a layer of a single-crystal semiconductor material which forms a heterojunction with a material of at least one of said emitter layer and said collector layer.

18. A bipolar transistor as claimed in claim 10, wherein said single-crystal semiconductor material layer included in said intrinsic base layer includes silicon germanium.

* * * * *